United States Patent
Fujinawa et al.

(10) Patent No.: US 8,092,600 B2
(45) Date of Patent: Jan. 10, 2012

(54) PLASMA APPARATUS AND PLASMA PROCESSING METHOD

(75) Inventors: Jun Fujinawa, Kanagawa (JP); Norihiro Kadota, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1065 days.

(21) Appl. No.: 11/933,658

(22) Filed: Nov. 1, 2007

(65) Prior Publication Data

US 2008/0102222 A1    May 1, 2008

(30) Foreign Application Priority Data

Nov. 1, 2006 (JP) .................................. 2006-297599

(51) Int. Cl.
*C23C 16/00* (2006.01)
*H01L 21/306* (2006.01)

(52) U.S. Cl. ............... 118/718; 118/723 I; 156/345.31; 156/345.48

(58) Field of Classification Search .............. 118/718, 118/719, 723 I, 723 IR, 723 AN; 156/345.3, 156/345.31, 345.32, 345.48, 345.49; 315/111.51
See application file for complete search history.

(56) References Cited

U.S. PATENT DOCUMENTS

| | | | | |
|---|---|---|---|---|
| 4,461,783 A * | 7/1984 | Yamazaki | ...................... | 136/258 |
| 4,524,717 A * | 6/1985 | Neumann et al. | .............. | 118/718 |
| 4,957,061 A * | 9/1990 | Ando et al. | ................... | 118/719 |
| 5,529,657 A * | 6/1996 | Ishii | .......................... | 156/345.26 |
| 6,044,792 A * | 4/2000 | Ogawa et al. | ............. | 118/723 E |
| 6,083,355 A * | 7/2000 | Spence | .......................... | 204/164 |
| 6,578,515 B2 * | 6/2003 | Sakamoto et al. | ........... | 118/723 I |
| 2005/0249875 A1 * | 11/2005 | Sasaki et al. | ................ | 427/248.1 |

FOREIGN PATENT DOCUMENTS

| | | |
|---|---|---|
| JP | 04-198483 A | 7/1992 |
| JP | 06-076281 A | 3/1994 |
| JP | 2000-096239 A | 4/2000 |
| JP | 2001-207269 A | 7/2001 |
| JP | 2004-031621 A | 1/2004 |
| JP | 2005-219427 A | 8/2005 |

OTHER PUBLICATIONS

Notice of Reasons for Refusal, dated Sep. 27, 2011, issued in corresponding JP Application No. 2006-297599, 8 pages in English and Japanese.

* cited by examiner

*Primary Examiner* — Luz L. Alejandro
(74) *Attorney, Agent, or Firm* — Sughrue Mion, PLLC

(57) ABSTRACT

The plasma apparatus includes a conveying unit for conveying a substrate in a conveying direction while being situated at a processing position, an elongated electric field forming unit for forming an induction electric field by a coil, opposed to the processing position, a power supply for supplying high frequency power to the coil, an elongated gas introducing unit and a separating unit for separating a region where the forming unit is arranged and a region where the introducing unit is arranged from each other in an airtight fashion, having an elongated dielectric window arranged between the processing position and the forming unit. The forming unit, the introducing unit and the dielectric window are arranged in such a way that there longitudinal directions are matched with a width direction of the substrate being conveyed, and orthogonal to the conveying direction.

19 Claims, 6 Drawing Sheets

PLASMA APPARATUS AND PLASMA PROCESSING METHOD

The entire contents of documents cited in this specification are incorporated herein by reference.

BACKGROUND OF THE INVENTION

The present invention relates to a technical field of plasma processing such as a film formation by plasma CVD, in particular, to a plasma apparatus and a plasma processing method making it possible to perform a continuous processing on an elongated substrate by an ICP system allowing a high quality and high speed processing.

As plasma forming methods for a plasma CVD apparatus, there are known a capacitively coupled plasma (CCP) system and an inductively coupled plasma (ICP) system.

In the CCP plasma system (hereinafter referred to as CCP system), a high frequency voltage is applied to two electrodes opposed to each other, thereby forming plasma between the electrodes.

The CCP system is advantageous, for example, in that it is of a simple construction and that it can easily meet a demand for an increase in size through an increase in the electrode area. Further, it is also advantageous in that, by forming a large number of through-holes in the electrodes and supplying gases (plasma gas and reaction gas) like a shower therethrough, it is possible to uniformly supply the gases to the entire film formation region (the gases can be easily made uniform) even if the areas of the electrodes are increased.

Thus, the CCP system is most widely used for plasma CVD in, for example, the field of production of semiconductor devices and liquid crystal devices.

On the other hand, the CCP system has a problem in that the electron density of the plasma is rather low (approximately $1\times10^8$ to $1\times10^{10}$ cm$^{-3}$) and that it is rather difficult to achieve an improvement in terms of film formation speed. Further, since the electrodes exist in the region where the plasma is formed, a film is also accumulated on the electrodes if the film formation is continued for a long period of time, making it impossible to perform a proper film formation.

As disclosed in JP 2005-219427 A and the like, for mass production, there is known a method according to which an elongated substrate is fed out of a roll formed by winding a substrate and in which a film formation by plasma CVD is effected by the CCP system while conveying the substrate which is wrapped around a drum. Here, in the CCP system, in order to form a high quality film, it is necessary to maintain the distance between the two electrodes with a high precision on the order of several hundred to several thousand μm. When such a drum is used in the CCP system, the drum constitutes one electrode; in this case, however, it is necessary to form the surface of the opposing electrode as a curved surface with a high precision in conformity with the drum and to arrange the electrodes with high positional accuracy, making it rather difficult to design the electrodes.

Further, in the CCP system, the requisite pressure for maintaining the plasma is rather high (which is usually approximately several tens to several hundred Pa), so in the case in which, as disclosed in JP 2005-219427 A and the like, a plurality of film formation spaces (film formation chambers) are connected together to continuously perform the film formation, mixing-up of gases may occur between the film formation chambers, resulting in a deterioration in film quality, etc.

As disclosed in JP 06-76281 A and JP 2000-96239 A, in the ICP plasma system (hereinafter referred to as ICP system), a high frequency power is supplied to an (induction) coil to thereby form an induction magnetic field to form an induction electric field, by means of which plasma is generated.

In the ICP system, in which a high frequency power is supplied to a coil to thereby form an induction electric field to generate plasma, there is no need to provide an opposing electrode, further, it is possible to easily generate plasma of a high density ($1\times10^{11}$ cm$^{-3}$ or more). Further, plasma can be generated at low pressure and low temperature, making it possible to form a thin film of a satisfactory film quality. Further, when, as disclosed in JP 2005-219427 A, an elongated substrate is conveyed while wrapped around a drum, there is no need for the drum to serve as an opposing electrode, so the drum is electrically independent. Thus, it is possible to perform various controls independent of the electric field forming means, such as an application of bias potential using the drum.

In the ICP system, however, it is difficult to achieve an increase in size, so it is rather difficult to apply the system to a film forming apparatus of a large area or to a film forming apparatus as disclosed in JP 2005-219427 A in which the film formation by plasma CVD is continuously effected on an elongated substrate.

SUMMARY OF THE INVENTION

As described above, in the ICP system, plasma is generated by forming an induction electric field by means of a coil, and the plasma distribution greatly depends on the configuration and size of the coil. Thus, in order to perform a large area processing, it is necessary to design an accordingly large coil capable of forming a uniform induction electric field, which means the design of the coil is very difficult.

In a plasma apparatus of the ICP system, it is a common practice to provide a dielectric window for transmitting a high frequency electric field and to separate the evacuated film formation space from the atmospheric pressure space in an airtight fashion, with the coil being installed in the atmospheric pressure space.

This dielectric window, which is in many cases formed of a ceramic material, increases in size with the increase in area. As the window size thus increases, it is necessary to increase the thickness of the dielectric window so that it may not crack due to the difference in pressure between the atmosphere and the vacuum. When the dielectric window is increased in thickness, the distance between the coil and the plasma generation region (film formation space) to which gases are supplied becomes rather large, so the electric field intensity in the plasma generation region is reduced. As a result, the high plasma density, which is an advantage of the ICP system, suffers a reduction; further, the uniformity in plasma distribution deteriorates. Further, the apparatus is quite liable to be increased in size and complicated.

Furthermore, in order to form a uniform thin film of high quality by plasma CVD, it is necessary to introduce the gases uniformly into the space corresponding to the film formation region.

As described above, in the CCP system, the gases are supplied like a shower through the through-holes formed in the electrodes, whereby, even when an increase in area is involved, it is possible to uniformly introduce the gases to the entire region in correspondence with the film formation region. In the ICP system, however, it is rather difficult, from the viewpoint of strength, precision, etc., to form through-holes serving as gas supply ports in the dielectric window. Further, if it is possible to form through-holes in the dielectric window, plasma will be allowed to be generated inside the through-holes, resulting in clogging of the through-holes due to the film formation therein. In the case in which spray-like nozzles formed of a conductor are provided directly below the dielectric window, the electric field formed by the coil is affected by the nozzles, resulting in a reduction in plasma density and unevenness in film formation.

Thus, in the ICP system, it is a common practice to introduce the gases from the periphery of the film formation region.

However, when an increase in area is involved, introduction of the gases from the periphery results in the gases being preferentially consumed in the periphery. Thus, the amount of gas allowed to reach differs between the peripheral portion and the central portion of the substrate, resulting in an increase in unevenness of film thickness distribution.

As a result, when a film formation is performed on a large area substrate by the ICP system, the film thickness of the central portion of the substrate is liable to be thinner than that of the peripheral portion thereof.

Due to the above-mentioned problem, despite its advantages in that it helps to provide low-temperature/low-pressure/high-density plasma, allows processing at low temperature with low damage, and provides a satisfactory film quality, the ICP system is rather difficult to apply to large area apparatuses intended for large substrates, and is mainly applied to small apparatuses.

The present invention has been made with a view toward solving the above-mentioned problems in the prior art. It is a first object of the present invention to provide a plasma apparatus for use in a plasma CVD apparatus or the like which makes it possible to perform processing on a large area substrate in a satisfactory manner and to attain a high productivity by utilizing the ICP system which advantageously helps to provide low-temperature/low-pressure/high-density plasma, allows processing at low temperature with low damage, and provides a satisfactory film quality.

It is a second object of the present invention to provide a plasma processing method implemented by the plasma apparatus.

In order to attain the first object described above, a first aspect of the invention provides an inductive coupling type plasma apparatus, comprising a conveying means for conveying a substrate in a predetermined conveying direction while being situated at a predetermined processing position, an electric field forming means for forming an induction electric field by a coil, the electric field forming means being elongated, opposed to the predetermined processing position and arranged in such a way that a longitudinal direction of the electric field forming means is matched with a width direction of the substrate being conveyed, and orthogonal to the predetermined conveying direction, a power supply for supplying high frequency power to the coil, a gas introducing means which is elongated and arranged in such a way that a longitudinal direction of the gas introducing means is matched with the width direction, and a separating means for separating a region where the electric field forming means is arranged and a region where the gas introducing means is arranged from each other in an airtight fashion, separating means having a dielectric window which is elongated and arranged between the predetermined processing position and the electric field forming means in such a way that a longitudinal direction of the dielectric window is matched with the width direction.

Preferably, the conveying means is a cylindrical drum around a circumferential surface of which the substrate is wrapped.

Preferably, the substrate is supplied to the conveying means from a feeding roll formed by winding an elongated substrate into a roll and is wound around a take-up roll after being fed by the conveying means.

Preferably, a distance from at least one of the electric field forming means, the gas introducing means and the separating means to the processing position is adjustable.

Preferably, the plasma apparatus has plural sets of the electric field forming means, the gas introducing means and the separating means which are arranged in the predetermined conveying direction of the substrate and have processing positions, respectively.

Preferably, the plural sets of the electric field forming means, the gas introducing means and the separating means are partitioned from each other by wall portions in a substantially airtight fashion.

It is preferable that the plasma apparatus further comprises an openable shutter partitioning each of the processing positions and an inner side of each of the wall portions from each other.

It is preferable that the plasma apparatus further comprises a vacuum evacuation means provided for the inner side of each of the wall portions.

Preferably, the coil has an elongated configuration and is arranged in such a way that a longitudinal direction of the coil is matched with the width direction of the substrate being conveyed.

It is preferable that the plasma apparatus further comprises means for adjusting an introducing direction in which a gas is introduced by the gas introducing means.

Preferably, the plasma apparatus has plural gas introducing means provided at different positions in a direction of a gap between the predetermined processing position and the dielectric window.

Preferably, the dielectric window is situated horizontally with respect to the predetermined processing position or vertically below the predetermined processing position.

Preferably, the electric field forming means, the gas introducing means and the separating means are formed as one set into an integral unit which is detachable.

In order to attain the second object described above, a second aspect of the invention provides a plasma processing method which uses an elongated electric field forming means for forming an induction electric field by means of a coil, an elongated gas introducing means, and an elongated dielectric window transmitting an electric field, comprising the steps of arranging the electric field forming means, the gas introducing means, and the dielectric window such that they are matched with each other in a longitudinal direction and that the electric field forming means and the dielectric window face each other, and performing processing on a substrate by plasma generated by the induction electric field formed by the electric field forming means and by a gas introduced by the gas introducing means while conveying in a direction orthogonal to the longitudinal direction the substrate being situated at a predetermined processing position facing the dielectric window.

According to the present invention, constructed as described above, the electric field forming means for forming the induction electric field by the (induction) coil, the dielectric window allowing transmission of the induction electric field generated by the coil arranged in the atmospheric pressure region to the vacuum region (plasma generation region), and the gas introducing means for supplying the gases (plasma gas and film formation gas) are elongated, and are arranged so as to be matched with each other in the longitudinal direction; further, plasma processing such as a film formation by plasma CVD is performed while conveying the substrate in a direction orthogonal to the longitudinal direction (width direction of the substrate).

Thus, even when processing is to be performed on a large area substrate, it is only necessary to elongate the linear electric field forming means and the dielectric window. Thus, according to the present invention, it is possible to perform processing on a large area substrate without involving a two-dimensional increase in the size of the electric field forming means, the dielectric window, and the gas introducing means; further, the design of the coil is facilitated, and there is no need to increase the thickness of the dielectric window. Further, it is possible to uniformly supply a sufficient amount of gas in correspondence with the entire processing region of the substrate by a gas introducing means of a simple construction, such as means obtained by forming a through-hole in a pipe. Thus, according to the present invention, even in the case of a large area substrate, it is possible to perform, in a satisfactory manner, a processing such as a formation of a thin film uniform over the entire surface thereof.

DESCRIPTION OF THE PREFERRED EMBODIMENTS

In the following, a plasma apparatus and a plasma processing method according to the present invention will be described in detail with reference to preferred embodiments shown in the accompanying drawings.

Figure 1:
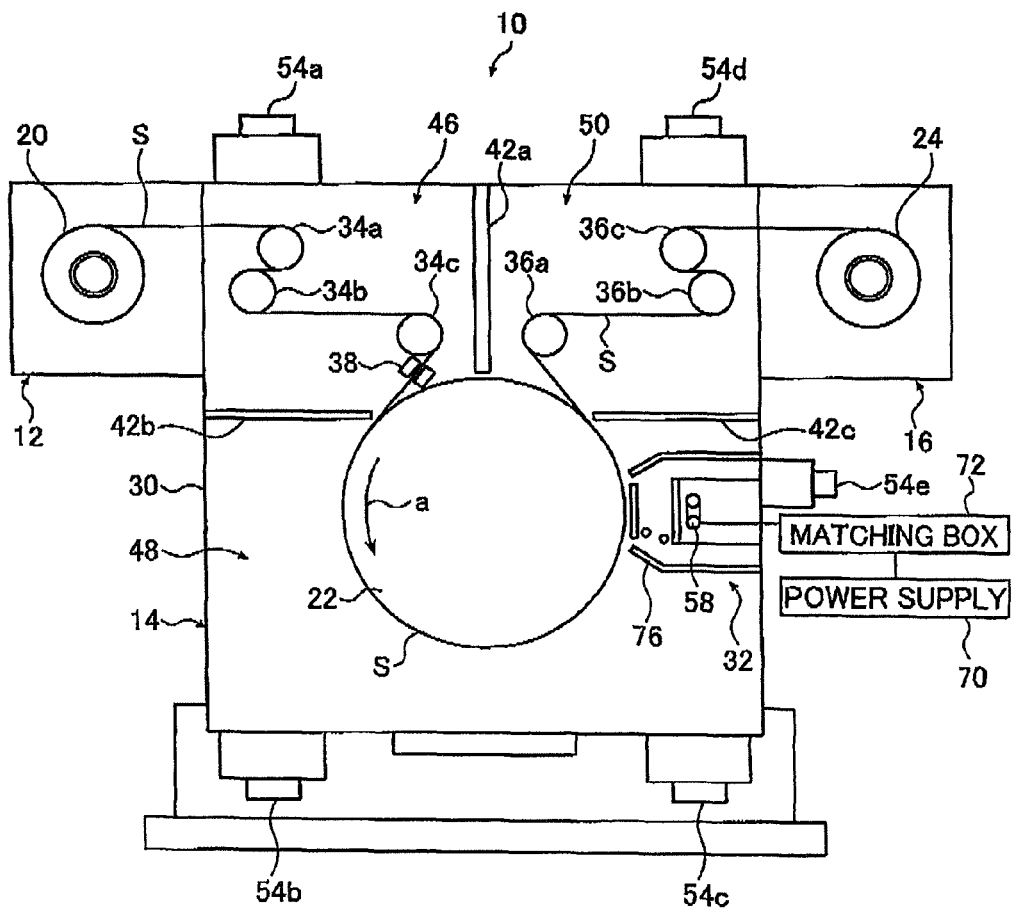
FIG. 1 is a conceptual diagram showing an embodiment of a CVD apparatus to which a plasma apparatus according to the present invention is applied.

FIG. 1 is a conceptual diagram showing an embodiment in which the plasma processing apparatus of the present invention for executing the plasma processing method of the present invention is applied to a plasma CVD apparatus.

FIG. 1 shows a plasma CVD apparatus 10 which forms a thin film on the surface of an elongated substrate S by plasma CVD of the inductively coupled plasma (ICP) system and which basically includes a feeding portion 12 for feeding the substrate 5, a film forming portion 14 for forming a thin film on the surface of the substrate S by plasma CVD based on the ICP plasma system, and a take-up portion 16 for winding into a roll the substrate S on whose surface a thin film has been formed.

Here, the film forming portion 14 performs a film formation on the surface of the substrate S by plasma CVD based on the ICP plasma system (hereinafter referred to as ICP system), and constitutes a plasma apparatus of the present invention.

In the plasma CVD apparatus 10 (hereinafter referred to as CVD apparatus 10) shown in FIG. 1, the substrate S on whose surface a thin film is to be formed is an elongated one, and is loaded in the feeding portion 12 as a substrate roll 20 wound into a roll. The substrate S undergoes the film formation by plasma CVD without being cut, and is wound into a roll by the take-up portion 16 to become a processed roll 24.

In the CVD apparatus 10, the substrate S moves from the feeding portion 12 (the substrate roll 20) to the film forming portion 14; the substrate S is wrapped around a drum 22 of the film forming portion 14 and reaches the take-up portion 16 (as the processed roll 24) from the film forming portion 14 via a predetermined route, without being cut. In this state, the CVD apparatus 10 continuously forms a thin film on the surface of the substrate S in the film forming portion 14 while feeding the substrate from the feeding portion 12, wrapping the substrate around the drum 22 for conveyance, and taking up the substrate at the take-up portion 16 (that is, while conveying the substrate S).

The feeding portion 12 is a well-known sheet-like object feeding apparatus which feeds an elongated sheet-like object wound into a roll without cutting it, and the take-up portion 16 is a well-known take-up means for taking up an elongated sheet-like object.

Accordingly, in addition to the members shown in FIG. 1, the feeding portion 12 and the take-up portion 16 may have well-known sheet-like object conveying means such as a guide roller, a tension roller, and a conveyance guide.

There are no particular limitations regarding the substrate S to be processed in the present invention. It is possible to adopt all materials allowing plasma CVD (plasma processing) of the ICP system, such as a resin film like a PET film, a metal sheet like an aluminum sheet, and a glass plate.

As described above, the substrate S supplied from the feeding portion 12 is supplied to the film forming portion 14.

The film forming portion 14 constitutes a plasma apparatus according to the present invention, and forms a thin film on the surface of the substrate S by plasma CVD of the ICP system according to the processing method of the present invention.

In the present invention, there are no particular limitations regarding the thin film to be formed by plasma CVD. It is possible to form all sorts of thin films that can be formed by plasma CVD of the ICP system. For example, it is possible to form as the thin film a vapor barrier film, specific examples of which include $SiN_x$ film, $SiO_x$ film, and $SiO_xN_y$ film.

As described below, the number of thin films formed on the substrate S according to the present invention is not restricted to one (single layer) but it is also possible to form a laminate film in which a plurality of thin films are stacked together. Further, the present invention is not restricted to the film formation by plasma CVD. It is also possible to exclusively introduce a plasma gas, without introducing any film formation gas, performing plasma cleaning or the like on the substrate surface.

Further, there are no particular limitations regarding the film formation gas to be used in film formation (the gas mainly contributing to reaction and film formation) and the plasma gas (the gas mainly contributing to discharge). According to the thin film to be formed, it is possible to use various types of gases used in plasma CVD. The introduction amount may be set as appropriate according to the target film forming speed and film thickness, the kind of thin film to be formed, the kind of gas to be used, etc.

Examples of the plasma gas include an inert gas such as argon, nitrogen, oxygen, and hydrogen. When forming various vapor barrier films as mentioned above for example, it is possible to use, as in the case of usual plasma CVD, $SiH_4$, $NH_3$, $O_2$, $N_2O$, tetraethoxysilane (TEOS), hexamethyldisilazane (HMDS) or the like as the material gas.

In the embodiment shown in FIG. 1, the film forming portion 14 has a vacuum chamber 30, the drum 22 arranged within the vacuum chamber 30, a plasma processing means 32, conveying rollers 34a, 34b, and 34c, conveying rollers 36a, 36b, and 36c, and a heating unit 38.

The interior of the vacuum chamber 30 is divided into an introduction chamber 46, a film formation chamber 48 in the lower part, and a feeding chamber 50 by three partition walls: partition walls 42b and 42c arranged horizontally and a partition wall 42a arranged vertically. More specifically, the introduction chamber 46 is a space on the upper, feeding portion 12 side (upper, left-hand side space shown in FIG. 1) defined by the partition walls 42a and 42b and the drum 22. The film formation chamber 48 is a lower space defined by the partition walls 42b and 42c and the drum 22. The feeding chamber 50 is a space on the upper, take-up portion 16 side (upper, right-hand side space shown in FIG. 1) defined by the partition walls 42a and 42c and the drum 22.

The introduction chamber 46, the film formation chamber 48, and the feeding chamber 50 are separated from each other in a substantially airtight fashion by the partition walls 42a, 42b, 42c and the drum 22.

On the outer side of the vacuum chamber 30, there are provided vacuum evacuation means 54a, 54b, 54c, 54d, and 54e for evacuating (achieving a reduction in pressure in) the interior of the vacuum chamber 30 to create a vacuum therein.

There are no particular limitations regarding the vacuum evacuation means 54a, 54b, 54c, 54d, and 54e. It is possible to adopt any type of apparatuses as long as they help to achieve a predetermined degree of vacuum and evacuation speed. Examples of the vacuum evacuation means include various types of vacuum pumps such as an oil diffusion pump, a cryopump, a turbo molecular pump, an oil rotation pump, and a dry pump, and a cryocoil or the like used as an auxiliary apparatus as needed.

The conveying rollers 34a, 34b, 34c and the conveying rollers 36a, 36b, 36c are both well-known conveying rollers used to convey sheet-like objects. The conveying rollers 34a, 34b, 34c and the conveying rollers 36a, 36b, 36c may be driving rollers to impart conveying force to the substrate S, or driven rollers to rotate as the substrate S is conveyed.

Further, at least one of the conveying rollers 34a, 34b, 34c and the conveying rollers 36a, 36b, 36c may also serve as a tension roller for adjusting the tension of the substrate S while keeping the tension at a predetermined tension.

The conveying rollers 34a, 34b, 34c are arranged in the introduction chamber 46, and the conveying rollers 36a, 36b, 36c are arranged in the feeding chamber 50.

The substrate S fed from the feeding portion 12 is first carried into the introduction chamber 46, and is successively guided by the conveying rollers 34a, 34b, and 34c to be wrapped around the drum 22 via a predetermined route before being conveyed to the film formation chamber 48 to undergo film formation. The substrate S, on which a thin film has been formed, is further conveyed by the drum 22 from the film formation chamber 48 to the feeding chamber 50, and is successively guided by the conveying rollers 36a, 36b, and 36c before being sent to the take-up chamber 16 via a predetermined route.

When performing the film formation on the substrate S, the introduction chamber 46 is evacuated by the vacuum evacuation means 54a, and the feeding chamber 50 is evacuated by the vacuum evacuation means 54d, respectively, whereby the chambers are maintained at a predetermined degree of vacuum.

In a preferred mode, the heating unit 38 is arranged between the conveying roller 34c in the introduction chamber 46 and the drum 22.

Prior to the film formation by plasma CVD, the heating unit 38 heats the substrate S to effect degassing or the like. There are no particular limitations regarding the heating unit 38. It is possible to adopt all sorts of heating means for heating sheet-like objects.

The drum 22 is a rotatable cylindrical object having a horizontal rotation shaft. A part of the drum 22 on the upper side is situated within the introduction chamber 46 and the feeding chamber 50, and the major portion thereof is situated within the film formation chamber 48. During the film formation by plasma CVD, a predetermined degree of vacuum is maintained within the film formation chamber 48 by the vacuum evacuation means 54b and 54c (and, further, by the vacuum evacuation means 54e).

The drum 22 is rotated in the direction of the arrow a by a well-known rotating means (not shown). Further, the distal ends (the ends on the side opposite to the vacuum chamber 30) of the partition walls 42a, 42b, and 42c are held very close to the drum 22, whereby the chambers are separated from each other in a substantially airtight fashion.

As stated above, the substrate S is conveyed while wrapped around the drum 22.

In the embodiment shown in FIG. 1, within the film formation chamber 48, the substrate S is completely wrapped around the drum 22. The CVD apparatus 10 performs the film formation by plasma CVD within the film formation chamber 48. That is, inside the film formation chamber 48, which is the film formation space (plasma processing space), the back surface (non-film-formation surface) of the substrate S is entirely in contact with the drum 22.

In this way, the drum 22 is used as the conveying means, and the substrate S is conveyed while wrapped around the drum 22, whereby no gas or plasma is allowed to get around to the back surface of the substrate S to effect the film formation, making it possible to properly effect the film formation exclusively on the front surface (film-formation surface) of the substrate S.

Further, at the film formation position, the substrate S is supported from behind by the drum 22, so it is possible to maintain the substrate S accurately and reliably at a predetermined processing position, making it possible to perform a highly precise film formation while always maintaining a proper distance (clearance) from a plasma source including a coil 58, a dielectric window 60, a first gas introducing means 62, and a second gas introducing means 64 described below (see FIG. 2).

Figure 5:
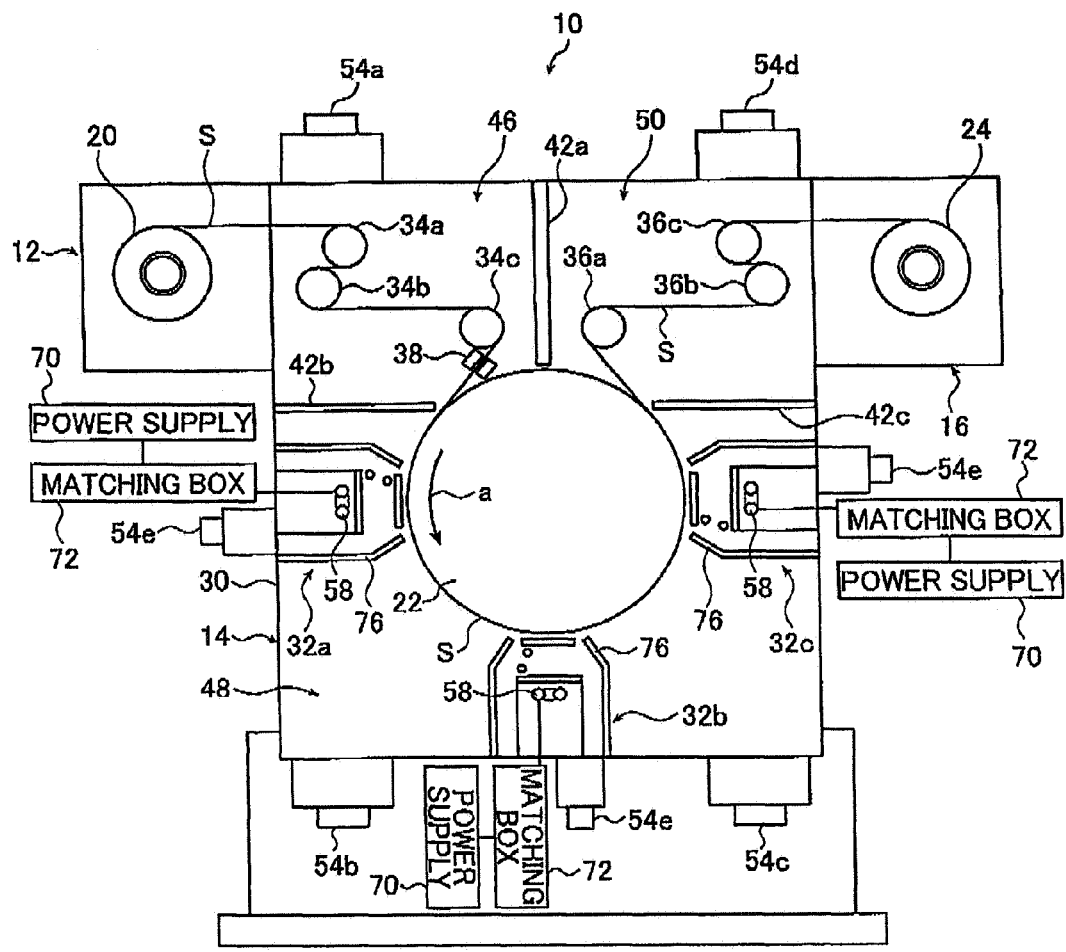
FIG. 5 is a conceptual diagram showing another embodiment of a CVD apparatus to which a plasma apparatus according to the present invention is applied.
Figure 7:
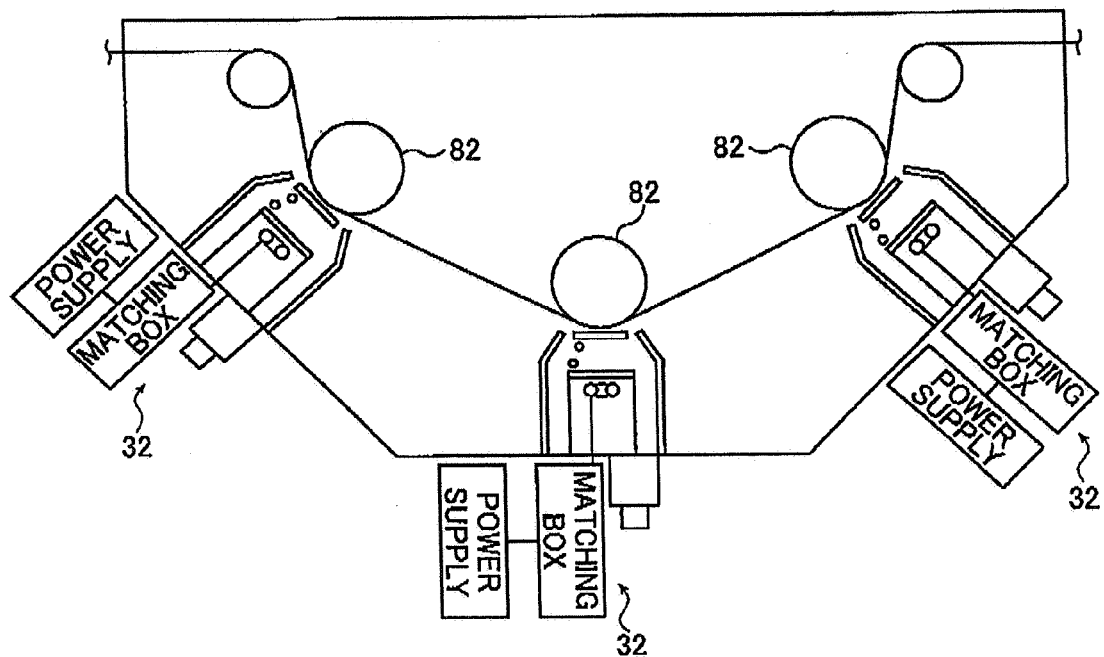
FIG. 7 is a conceptual diagram showing an embodiment of a CVD apparatus to which a plasma apparatus according to the present invention is applied.

Further, due to the use of the drum 22, it is possible to achieve a reduction in apparatus size even in the film formation on an elongated substrate S of the same width as compared with the case in which drum 22 is not used. Further, as in the cases of the apparatuses as shown in FIGS. 5 and 7 described below, in the present invention, it is possible to arrange a plurality of plasma processing means 32 (a plurality of plasma sources). In those case, due to the use of the drum 22, it is possible to more suitably realize the effect of a reduction in size.

In a preferred mode, the CVD apparatus 10 has a temperature adjusting means for the drum 22. Due to the provision of the temperature adjusting means for the drum 22, it is possible to perform cooling of the substrate S, heating of the substrate S to a temperature suitable for film formation, etc., preferably making it possible to achieve an increase in film formation speed through heating prevention, prevent damage of the substrate S, and form a high quality thin film. In particular, in the ICP system utilized in the present invention, the plasma is of high density and low temperature, so it is possible to achieve a marked effect in realizing an increase in film formation speed through the synergistic effect obtained by cooling the substrate S and the inherent low plasma temperature of the ICP system.

There are no particular limitations regarding the temperature adjusting means, and it is possible to use various types of means. It may be means for supplying a heating medium or refrigerant to the drum 22, or may be a heater, a cooling means, or the like arranged inside the drum 22. It is also possible to provide only one of the cooling means and the heating means. Note that the temperature adjustment range for the drum 22 is preferably −100 to 300° C., and, more preferably, −30 to 100° C.

As described above, in the CCP system, it is necessary to use a drum as an opposing electrode, whereas, in the CVD apparatus 10 which uses the ICP system, the drum 22 is completely electrically independent of the plasma processing means 32 described below.

Here, as a preferred mode, the CVD apparatus 10 shown in FIG. 1 has a function to ground the drum 22, a function to insulate the drum 22, and a function to apply a bias potential to the drum 22, allowing the selection of one of these functions.

With this construction, it is possible to select/set the electrical functions of the drum 22 according to the objective such as the desired film characteristic. For example, at the time of a high speed film formation (when performing a film formation while conveying the substrate S at high speed), if the bias potential applying function is selected, it is possible to promote/assist the densification of the film, thereby attaining both an improvement in film quality and an increase in speed (an improvement in productivity).

The present invention is not restricted to the above described construction, and it is also possible for the drum 22 to have two of the three functions of grounding, insulating, and bias potential application, while selecting one of the two functions according to the objective. Alternatively, the drum 22 may have only one of the three functions. The bias potential application method may be selected as appropriate from the application systems of direct current system, high frequency system, pulse system, etc. according to the film characteristics and the film formation speed as required.

The plasma processing means 32 is a portion constituting a feature of the present invention. The plasma processing means 32 supplies high frequency power to the coil 58 to thereby form an induction electric field, and introduces film formation gas and plasma gas into the region where this induction electric field is formed, thereby forming a thin film on the surface of the substrate S by plasma CVD of the ICP system. In the film formation chamber 48, a portion of the circumferential surface of the drum 22 (a portion of the front surface of the substrate S conveyed by the drum 22) facing the plasma processing means 32 constitutes a predetermined processing position.

Figure 2:
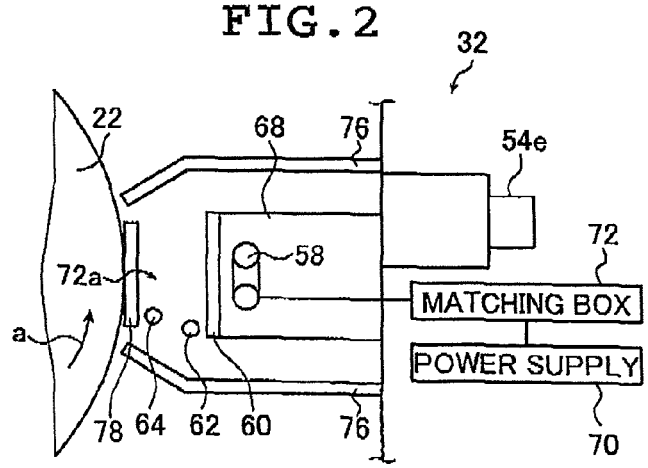
FIG. 2 is a conceptual diagram showing a plasma processing means of the CVD apparatus shown in FIG. 1.

As shown in FIG. 2, the plasma processing means 32 of the illustrated embodiment basically includes the coil 58, the dielectric window 60, the first gas introducing means 62, the second gas introducing means 64, a casing 68, a high frequency power supply 70, a matching box 72, a separating wall 76, and a shutter 78.

The coil 58 is an induction coil which is supplied with high frequency power from the high frequency power supply 70 and generates an induction magnetic field to thereby form a high frequency induction electric field due to the generation of the induction magnetic field. In the CVD apparatus 10 of the embodiment shown in FIG. 1, the coil 58 constitutes the electric field forming means.

Figure 3A:
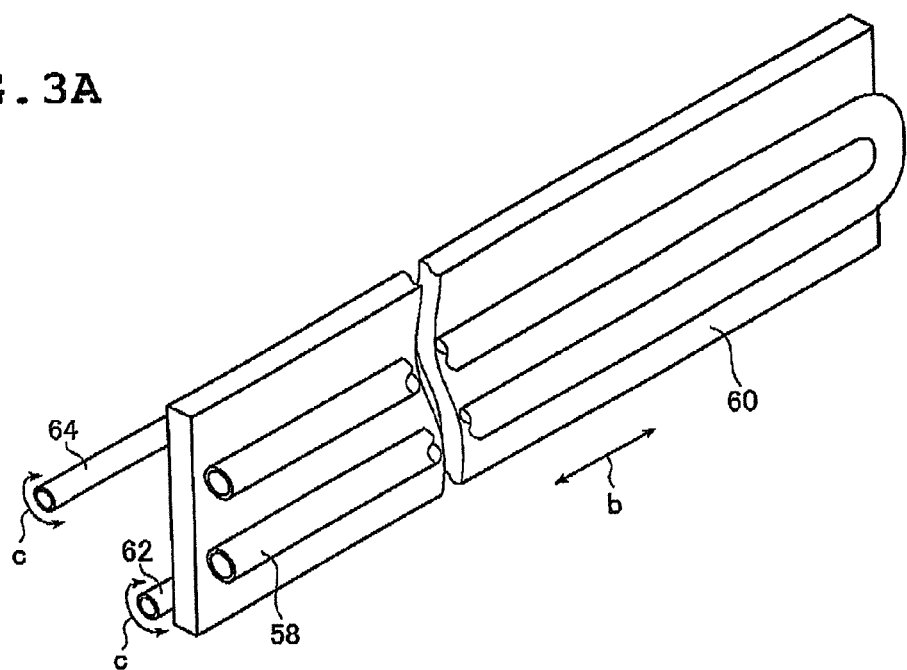
FIGS. 3A and 3B are conceptual diagrams showing a part of the plasma processing means shown in FIG. 2.

As conceptually shown in FIG. 3A, the coil 58 of the illustrated embodiment is formed in a substantially U-shaped elongated configuration that is obtained by bending a tube formed of metal (e.g., copper). The coil 58 is arranged such that a longitudinal direction thereof is matched with the rotation axis (central axis) of the drum 22 indicated by the arrows b, with one end thereof being connected to the high frequency power supply 70 (the matching box 72). Further, the coil 58 is arranged such that two elongated regions thereof uniformly face the drum 22. The coil 58 (metal tube) of the embodiment shown in FIG. 2 is hollow, and a refrigerant such as cooling water can flow therethrough.

As stated above, the substrate S is conveyed while wrapped around the drum 22, so the coil 58 is arranged such that the longitudinal direction (the winding center of the elongated portion) is matched with the rotation axis of the drum 22, that is, matched with the width direction of the substrate which is orthogonal to the conveying direction (the direction indicated by the arrow b of FIG. 3A, which is perpendicular to the planes of FIGS. 1 and 2). That is, in the CVD apparatus 10 of the embodiment shown in FIG. 1, the elongated U-shaped coil 58 extends in the width direction of the substrate which is orthogonal to the conveying direction of the substrate S, and faces the drum 22 (i.e., the processing position).

The high frequency power supply 70 is a high frequency power supply for supplying high frequency power to the coil 58. The high frequency power supply 70 is arranged outside the vacuum chamber 30, and is connected to the coil 58 through the matching box 72.

There are no particular limitations regarding the power supply frequency of the high frequency power supply 70, and it is possible to utilize various frequencies such as 13.56 MHz, which is usually adopted. The power supply frequency preferably ranges from 1 to 3000 MHz and, more preferably, from 10 to 200 MHz. Further, it is also possible to use high frequency power supplies of different frequency bands in combination.

In the plasma processing means 32, the coil 58 is arranged within the closed space defined by the dielectric window 60 and the casing 68 while separated from the interior of the film formation chamber 48 in an airtight fashion. The pressure inside the casing 68 is the atmospheric pressure.

That is, in the embodiment shown in FIG. 2, the dielectric window 60 and the casing 68 function as a separating means which separates in an airtight fashion the atmospheric pressure region where the electric field forming means (the coil 58) is arranged from the vacuum region (the region where plasma is generated).

The dielectric window 60 is an elongated rectangular plate member whose length in the width direction of the substrate is somewhat larger than that of the coil 58, and is arranged between the coil 58 and the drum 22 such that the longitudinal direction thereof is matched with the rotation axis of the drum 22 (the width direction of the substrate). That is, the dielectric window 60 is also arranged so as to extend in the width direction of the substrate.

The induction electric field formed by the coil 58 is transmitted through the dielectric window 60 to reach the region where gases are supplied by the gas introducing means described below (the region where plasma is formed). Thus, the dielectric window 60 is formed of a material allowing transmission of the induction electric field formed by the coil 58, such as a ceramic material. Examples of the ceramic material forming the dielectric window 60 include quartz, alumina, ceramics and sintered materials of various nitrides, oxides, and carbides, or combinations thereof.

Between the dielectric window 60 and the drum 22, there is arranged the first gas introducing means 62 for supplying plasma gas and film formation gas (reaction gas) to the region where plasma is formed.

The first gas introducing means 62 is formed as an elongated cylindrical pipe one end of which is closed and the other end of which is connected to the gas supply source. As conceptually shown in FIG. 3B, a large number of through-holes 63 serving as gas ejection holes are formed in the circumferential surface thereof and arranged in the longitudinal direction thereof (the direction of the center line of the cylinder).

The first gas introducing means 62 is arranged such that the longitudinal direction thereof is matched with the width direction of the substrate. That is, a large number of gas ejection holes are arranged in the width direction of the substrate.

Between the first gas introducing means 62 and the drum 22, there is arranged the second gas introducing means 64 which also serves to supply gas.

The second gas introducing means 64 is of the same construction as the first gas introducing means except that the second gas introducing means 64 is arranged nearer to the drum 22. The second gas introducing means 64 is arranged such that its longitudinal direction thereof is matched with the width direction of the substrate.

In the illustrated embodiment, as a preferred mode, there are arranged the gas introducing means on the upstream side of the film formation region with respect to the conveying direction of the substrate S. Further, there is arranged the vacuum evacuation means 54e so as to perform an evacuation from the downstream side, whereby the gases are caused to flow efficiently, thus achieving an improvement in terms of gas utilization efficiency, film formation efficiency, and film formation speed.

Further, the position where the gas introducing means are connected to the gas supply source is not restricted to one end of each of the pipes described above. The connection to the gas supply source may be effected at both ends, at the center, or at a plurality of positions in the width direction of the pipe.

The film forming portion 14, which constitutes the plasma apparatus of the present invention, conveys the substrate on which a thin film is to be formed in a predetermined direction, and includes the electric field forming means using a coil, the dielectric window through which the electric field formed by the coil is transmitted, and the supply means which supplies gases to the plasma formation region, with these components being elongated and arranged such that their longitudinal direction is matched with the width direction orthogonal to the conveying direction of the substrate.

As disclosed in JP 6-76281 A and JP 2000-96239 A, in conventional plasma CVD of the ICP system, the film formation region is to be perceived as a two-dimensional region, in which an induction electric field is to be formed uniformly all over and to which gases are to be supplied.

Thus, when the apparatus size increases, it is necessary to provide a coil for forming an electric field over a large area and a dielectric window of a large area, with the result that the coil design is rather difficult and that the apparatus construction is complicated due to the increase in the size of the coil and the dielectric window, and further, it is impossible to supply the gases uniformly to the plasma region. Further, as the size of the dielectric window increases, it is necessary to thicken the dielectric window in order to secure the requisite strength, with the result that the coil for forming the induction electric field and the plasma formation region are spaced apart from each other. Thus, the high plasma density, which is an advantage of the ICP system, is reduced, making it impossible to perform the film formation (processing) at high speed.

Thus, conventionally, plasma CVD of the ICP system is rather difficult to be applied to a large substrate, and its application is generally restricted to small apparatuses.

In contrast, in the present invention, the film formation region (the region where plasma processing is performed) is to be perceived as a one-dimensional region, and the electric field forming means, the dielectric window, and the gas introducing means (in the following, for the sake of convenience, these three components will be collectively referred to as the "plasma source") are elongated linear ones. The above-mentioned one-dimensional film formation region extends in the longitudinal direction of the plasma source (i.e., width direction of the substrate), and film formation is performed while conveying the substrate in a direction orthogonal to this longitudinal direction. That is, the film formation is performed by the plasma source extending in the width direction of the substrate S while conveying the substrate S.

Thus, according to the present invention, it is possible to perform the film formation continuously on an elongated substrate. Further, even in the case of a large (large width) substrate, the present invention is applicable solely by adopting an elongated plasma source in conformity with the width of the substrate, so it is possible to prevent an increase in the size of the apparatus. Further, due to the construction which is elongated not two-dimensionally but one-dimensionally, the design of the plasma source such as the coil is facilitated, and the construction thereof is simplified. Further, it is possible to form an induction electric field of a sufficient strength in the film formation region. Further, due to the elongated structure, there is no need to thicken the dielectric window in order to secure the requisite strength thereof, with the result that the distance between the coil 58 serving as the electric field forming means and the gas supply position (the plasma formation region) is reduced to form an electric field of a sufficient intensity at the gas supply position, and thus, combined with the inherently high density plasma of the ICP system, it is possible to generate a plasma of still higher density and to perform a high speed film formation.

Further, due to the one-dimensional film formation region, even in the case of a large substrate, it is possible to supply a sufficient amount of gas uniformly in correspondence with the entire film formation region by using simple gas supply means formed, for example, by providing through-holes for gas supply in the circumferential surfaces of pipes.

As a result, using plasma CVD of the ICP system which provides the low-temperature/low-pressure/high-density plasma and makes it advantageously possible to perform processing at low temperature with low damage and to attain a satisfactory film quality, however, which had been rather difficult to apply to a large substrate, the present invention can realize a high speed film formation on a large substrate S by means of a plasma source of a simple construction, thus allowing the film formation with high productivity.

Further, a high density plasma is generated immediately after the introduction of the gas, and the gas is decomposed to deposit a film, so the residence time of the film formation gas (decomposition component) is short, and the generation of particles and the generation of a decomposition higher order component due to the vapor-phase residence of the gases are suppressed, making it possible to prevent a deterioration in film quality due to particles or the like. Further, since the long-term residence of the gases can be suppressed, it is possible to suppress the generation of particles and higher order components due to the long-term residence, resulting in an improvement in terms of gas introducing amount, that is, a film forming speed. In particular, in the construction of the illustrated embodiment, the vacuum evacuation means 54e is provided for each plasma processing means 32 (plasma source) to adjust the balance of the gas supply and the vacuum evacuation, whereby the gas residence time is properly controlled, thereby making it easier to achieve further improvements in terms of film forming speed and film quality.

The present invention which uses such an elongated plasma source allows the high speed film formation and uniform film formation over a long period of time in a stable manner, makes it easy to control particles, and is superior in maintenance property. Due to these features, the present invention can advantageously provide particularly superior characteristics and effects in uses where a continuous film formation (continuous plasma processing) for a long period is to be performed on an elongated substrate S such as an elongated substrate S wound into a roll.

In the plasma apparatus of the present invention, there are no particular limitations regarding the length of the plasma source (the size in the width direction of the substrate), and it is only necessary for the plasma source to be long enough to be capable of forming an electric field and introducing the gases over the entire region in the width direction of a substrate S of a maximum size. Thus, it is desirable for the coil 58 (the electric field forming means), the dielectric window 60, and the gas introducing means (the regions having gas discharge ports) to have a length larger than the maximum size in the width direction of the corresponding substrate S.

Further, there are no particular limitations regarding the width of the plasma source (its size in the conveying direction of the substrate S). It is determined as appropriate according to the thickness of the film to be formed, the gas supply amount, the conveying speed of the substrate S, etc. However, an excessively large plasma source width would result in a structure similar to that of the conventional ICP plasma apparatus in which the film formation region is perceived two-dimensionally regarding the conveying direction of the substrate S, making it impossible to supply the reaction gas uniformly to the entire film formation region in the conveying direction of the substrate S. Thus, taking this point into consideration, it is desirable for the width of the plasma source to range from 10 to 1000 mm, in particular, from 50 to 500 mm.

In the plasma processing means 32 of the illustrated embodiment, there is arranged as the electric field forming means, the elongated, substantially U-shaped coil 58 extending in the width direction of the substrate, obtained by bending a linear elongated metal tube at around the center thereof, as a preferred mode in which the coil is easy to design and construct and in which a sufficient induction electric field can be formed.

Figure 4:
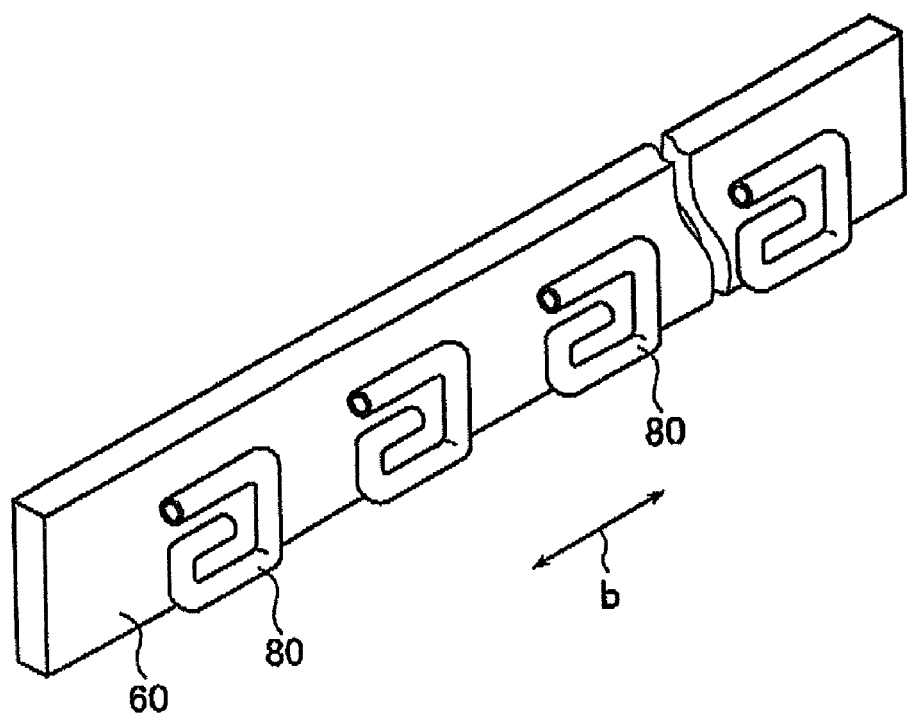
FIG. 4 is another conceptual diagram showing an electric field forming means that can be used in the plasma apparatus of the present invention.

However, the present invention is not restricted to this construction. Instead of the coil bent into a substantially U-shaped configuration, it is also possible to adopt a linear (substantially I-shaped) coil such as a metal tube, and arrange it such that its longitudinal direction is matched with the width direction of the substrate. Alternatively, as schematically shown in FIG. 4, it is also possible to arrange a plurality of small coils 80 in the width direction of the substrate (the direction indicated by the arrows b), thereby forming an elongated electric field forming means whose longitudinal direction is matched with the width direction of the substrate (an electric field forming means extending in the width direction of the substrate). When using a plurality of coils, it is possible to supply high frequency power through distribution from a single high frequency power supply to the plurality of coils. Alternatively, it is possible to provide a high frequency power supply for each coil. Further, in order to adjust, for example, mutual interference between the coils and plasma distribution, high frequency power supplies whose conditions such as frequencies differ from each other may also be used.

Also, regarding the gas introducing means, the first gas introducing means 62 and the second gas introducing means 64 having a large number of through-holes (e.g., the through-holes 63 of the first gas introducing means 62) in the circumferential surfaces of cylinders are adopted as a preferred aspect which is easy to design and construct and which allows the gas supply in a sufficient amount.

However, the present invention is not restricted to this construction. It is also possible to adopt various types of gas introducing means as long as they can supply gases uniformly in the width direction of the substrate, e.g., ones in which gas introduction ports are arranged in the width direction of the substrate or ones having gas introduction ports elongated in the width direction of the substrate. For example, it is possible to adopt gas introducing means which are elongated in the width direction of the substrate and in which gas supply nozzles independent of each other are arranged in the width direction of the substrate. Further, it is also possible to arrange, in the width direction of the substrate, a plurality of means of the same construction as the first gas introducing means 62, thereby forming a gas introducing means.

It is possible for the first gas introducing means 62 and the second gas introducing means 64 to supply the same gas to the plasma formation region. Alternatively, they may supply different gases, for example, the first gas introducing means 62 may supply plasma gas while the second gas introducing means 64 may supply film formation gas.

Further, while the first gas introducing means 62 and/or the second gas introducing means 64 may be one in number as in the illustrated embodiment, it is also possible to provide a plurality of them as needed.

Further, the CVD apparatus 10 of the present invention is not restricted to the construction having both the first gas introducing means 62 and the second gas introducing means 64, and it may also have only any one of the two.

However, it is more desirable, as in the case of the first gas introducing means 62 and the second gas introducing means 64 of the illustrated embodiment, to provide two or more gas introducing means at different positions in the gap between the drum 22 (the processing position) and the dielectric window 60, that is, at positions at different distances from the substrate S (or the coil 58).

Generally speaking, in plasma CVD, the plasma gas is more easily turned into plasma on the side nearer to the coil 58 (the introduction electric field generation source), and the film formation gas contributes to the film formation at a higher efficiency on the side nearer to the substrate S. If the film formation gas is introduced to a position which is spaced apart from the substrate S and in which the plasma density is high, the generation of particles, etc. causing a deterioration in film quality is likely to occur.

Thus, as in the illustrated embodiment, two gas introducing means are provided at positions at different distances from the substrate S, and plasma gas is introduced from the first gas introducing means 62 nearer to the coil 58, whereas film formation gas is introduced from the second gas introducing means 64 nearer to the drum 22, i.e., the substrate S, whereby high density plasma is generated in the region near the coil 58 and is brought into contact with the film formation gas in the vicinity of the substrate S, thereby preventing the generation of particles, etc. and performing the film formation at a high speed and a high efficiency. Alternatively, it is also possible to introduce a mixture gas whose plasma gas mixing ratio is high from the first gas introducing means 62, and to introduce a mixture gas whose reaction gas mixing ratio is high from the second gas introducing means 64. Further, by providing a plurality of gas introducing means at positions having different distances from the substrate as described above, it is possible to increase the gas introducing amount, which is suitable for a high speed film formation.

In particular, when, as in the apparatus of the illustrated embodiment, a plurality of gas introducing means are provided and the vacuum evacuation means 54e is provided for each plasma processing means 32 (plasma source), it is possible to adjust to a large degree the balance between the introduction and discharge of the gases, so the film quality and film formation speed can be easily optimized.

Note that, in the present invention, the number of gas introducing means arranged at positions having different distances from the substrate S is not restricted to two as in the illustrated embodiment. Alternatively, it is also possible to provide three or more gas introducing means, adding a third gas introducing means, a fourth gas introducing means, etc.

However, when the number of gas introducing means provided at different positions in the gap between the drum 22 and the dielectric window 60 increases, the distance between the coil 58 serving as the induction electric field forming means and the substrate S increases. Further, the film formation gas itself becomes hard to decompose. Thus, when providing a plurality of gas introducing means, it is desirable for their number to be two as shown in the illustrated embodiment.

Figure 3B:
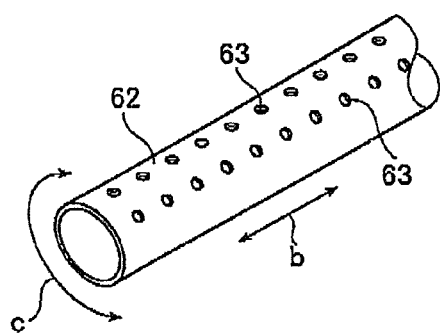

Here, as a preferred mode, the first gas introducing means 62 and the second gas introducing means 64 of the illustrated embodiment are rotatable (i.e., capable of angle adjustment) around the center lines of the cylinders as indicated by the arrows c of FIGS. 3A and 3B, whereby it is possible to vary the gas introducing direction (ejecting direction). More preferably, the two gas introducing means are allowed to rotate by 180 degrees from a direction in which the gas is ejected so as to impinge upon the surface of the dielectric window 60 at a right angle to an opposite direction in which the gas is ejected toward the drum 22.

Each of the gas introducing means is rotated by a well-known method in which an elongated bar-like object is rotated around the longitudinal direction.

In this way, the gas introducing direction can be changed, whereby it is possible to make an adjustment as to whether a higher priority is given to the plasma generation (eject to the dielectric window 60 side) or a higher priority is given to the film formation (eject to the substrate S side), making it possible to perform a more efficient processing. Further, in the case where the first gas introducing means 62 introduces the plasma gas and the second gas introducing means 64 introduces the film formation gas, the first gas introducing means 62 ejects the gas toward the dielectric window 60, and the second gas introducing means 64 ejects the gas toward the drum 22, whereby it is possible to effect the gas ejection to suitable regions according to the functions of the gases. Further, by setting an introducing direction with which the highest gas consumption efficiency can be achieved, it is also possible to improve the gas utilization efficiency.

Further, as in the illustrated embodiment, by using the first gas introducing means 62 and the second gas introducing means 64 which are of an elongated pipe-shaped configuration, the gas introducing direction can be easily changed solely through rotation as described above.

It goes without saying that, even in a case in which there are adopted gas introducing means of a different construction from that of the first gas introducing means 62, etc., it is desirable for the gas introducing direction to be changeable.

In a preferred mode, the plasma processing means 32 of the illustrated embodiment has the separating wall 76 so as to accommodate the dielectric window 60, the casing 68, the first gas introducing means 62, and the second gas introducing means 64.

The separating wall 76 separates the interior and exterior of the wall in a substantially airtight fashion together with the drum 22. Further, the degree of vacuum of the interior of the separating wall 76 can be adjusted by the vacuum evacuation means 54e, independently of the exterior. For the film formation chamber 48, there are arranged the vacuum evacuation means 54b and 54c, making it possible to adjust the degree of vacuum of the exterior of the separating wall 76.

In this way, the plasma generation region is isolated in an airtight fashion by the separating wall 76, and the pressures of the plasma generation region can be independently adjusted, whereby, when a plurality of plasma processing means 32 are provided in the conveying direction of the substrate S as described below, it is possible to control/drive the individual plasma processing means 32 independently of each other. As a result, the plasma processing means 32 can generate the plasma without affecting for each other, with each performing the film formation (or plasma processing) in an optimum fashion.

Further, while the ICP system basically provides low pressure plasma and can easily maintain the difference in pressure between the film formation regions (processing regions) as stated above, it becomes possible by virtue of the construction as described above to maintain the difference in pressure with a higher precision, and to more reliably prevent a contamination due to the gases discharged from the other plasma processing means 32.

As a preferred mode, the illustrated embodiment has the shutter 78.

The shutter 78 is movable between the plasma sealing position for sealing the plasma with respect to the processing position shown in FIG. 2, which is between the second gas introducing means 64 and the drum 22, and an opening position completely retracted from this plasma sealing position, thus closing/opening the plasma generation region with respect to the substrate S.

Due to the provision of the shutter 78, it is possible, for example, to prevent the contamination of the substrate S with particles, etc. peeled off from the inner side of the separating wall 76 when the apparatus is not in use and the contamination due to the gases flowing in from the other plasma processing means 32 when the apparatus is not in use. Further, due to the provision of the shutter 78, it is possible to perform an adjustment (pre-deposition) until the plasma condition is stabilized prior to the start of the film formation. After the start of the gas introduction and the supply of high frequency power to the coil 58, it is made sure that the plasma condition has been stabilized, and then the shutter 78 is opened to start the film formation, thereby making it possible to perform a more stable film formation.

In the plasma processing means 32, it is desirable for the portions that can be possibly brought into contact with plasma (except for the dielectric window 6Q), that is, the outer surface of the casing 68 and the inner surface of the separating wall 76, to be entirely covered with detachable adhesion-proof plates.

As a result, it is possible to prevent particles, etc. generated through film formation from directly adhering to the components of the plasma processing means 32, so it is possible to clean the interior of the means solely by replacing the adhesion-proof plates at the time of maintenance. Further, in the present invention, the dielectric window 60 is also formed in an elongated linear configuration, so it can be easily replaced at the time of maintenance.

For the adhesion-proof plates, it is possible to use various types of adhesion-proof plates used for preventing the adhesion and the like of particles to the chamber inner walls in vacuum evaporation apparatuses, CVD apparatuses or the like.

Other than the method using adhesion-proof plates, the cleaning of the interior of the apparatus may be effected by plasma cleaning which is generally utilized in CVD apparatuses.

In the film forming portion 14, the plasma processing means 32 (that is, the separating wall 76, the shutter 78, the first gas introducing means 62, the second gas introducing means 64, the coil 58, the dielectric window 60, and the casing 68) is preferably formed as an integral unit which is detachable with respect to the film forming portion 14 (that is, the main body of the plasma apparatus). In particular, it is desirable to fix the plasma processing means 32 to a flange detachable with respect to the vacuum chamber 30 from the outside, thus making the plasma processing means 32 detachable with respect to the film forming portion 14 through attachment/detachment of this flange.

With this construction, it is possible to remove the plasma processing means 32 from the apparatus for maintenance, repair, etc., thus achieving an improvement in terms of workability and facilitating the replacement of the plasma processing means 32 at the time of breakdown, maintenance or the like.

In the present invention, to facilitate the maintenance, it is desirable to form at least the plasma source (the gas introducing means, the dielectric window (and the casing), and the coil (the electric field forming means)) as an integral unit which is detachable with respect to the apparatus main body.

Further, in the CVD apparatus 10, it is desirable for at least one of the first gas introducing means 62, the second gas introducing means 64, the dielectric window 60, and the coil 58 to be allowed for an adjustment of its distance from the drum 22. It is more desirable for all of the first gas introducing means 62, the second gas introducing means 64, the dielectric window 60, and the coil 58 (that is, the plasma source) to be allowed for the adjustments of their distances from the drum.

With this construction, the distance between the drum 22 and the plasma source is adjusted according to the gases to be used, the kind of thin film to be formed and the target film forming speed, making it possible to perform an optimum film formation. Further, even when the thickness of the substrate S is changed, the adjustment can be appropriately made, thus making it possible to perform the film formation properly.

While there are no particular limitations regarding the adjusting distance, it preferably ranges approximately from 1 to 500 mm.

By setting the adjusting distance to this range, it is advantageously possible to suitably utilize the features of the ICP system, which provides low-temperature/low-pressure/high-density plasma and makes it possible to absorb to a sufficient degree a change in the thickness of substrate S to be processed.

In the plasma processing means 32 (the film formation chamber 48), it is desirable to be able to adjust the gas introducing amounts from the first gas introducing means 62 and the second gas introducing means 64 and the evacuation speed of the vacuum evacuation means 54e such that the gas residence time attains the target time set as appropriate and that the plasma pressure ranges from 0.1 to 100 Pa.

This makes it possible to prevent the generation of particles and decomposition higher order components due to a gas phase coupling of the film formation gas, enabling the formation of a thin film of a satisfactory film quality to be performed in a stable manner.

The gas residence time is the period of time that the gases introduced from the gas introducing means stay in the film formation space.

More specifically, it is the period of time that the active species (film formation precursor) contributing to a film deposition stays within the film formation system without being turned into a film, and the active species are obtained through decomposition of the gases in the plasma after their introduction from the gas introducing means.

While in the CVD apparatus 10 of illustrated embodiment, the film formation chamber 48 has only one plasma processing means 32, the present invention is not limited to as such and may provide a plurality of plasma processing means 32 (plasma sources) arranged in the conveying direction of the substrate S.

FIG. 5 shows an embodiment of such a construction. In the embodiment shown in FIG. 5, three plasma processing means 32 (32a, 32b, and 32c) are arranged within the film forming portion 14 (film formation chamber 48). In the present invention, by using elongated linear plasma sources, it is possible to minimize an increase in size and complication of the apparatus, making it possible to arrange a plurality of plasma sources within a small space.

In the present invention, the number of plasma processing means 32 arranged in the conveying direction is not restricted to three, and it is also possible to arrange two or four or more plasma processing means 32.

By arranging a plurality of plasma processing means 32 in the conveying direction of the substrate S as described above, it is possible to continuously form a multi-layer film by one processing. Further, by forming the same film by each of the plasma processing means 32, it is possible to achieve an improvement in terms of film formation speed.

As a preferred mode, the plasma processing means 32 illustrated are separated from each other in an airtight fashion by the separating walls 76, and each of them has the vacuum evacuation means 54e, so it is possible to generate the plasma without involving a mutual influence, thus enabling each means to perform an optimum processing.

When arranging a plurality of plasma processing means 32 in the conveying direction of the substrate S as described above, it is possible for the individual plasma processing means to form a multi-layered film through formation of the same film or to form a multi-layered film through formation of different films.

Further, the present invention is not restricted to one in which all the plasma processing means 32 perform the film formation, however, it is also possible for at least one of the means to perform a modification or cleaning on the surface of the substrate S through plasma processing. For example, it is possible to arrange the system such that the plasma processing means 32a arranged on the most upstream side performs a plasma cleaning of the surface of the substrate S and the second plasma processing means 32*b* and the third plasma processing means 32*c* perform the film formation by plasma CVD.

Here, it should be noted that, in the plasma CVD of the ICP system, the film formation is also effected on the plasma processing means 32 (adhesion-proof plate) including the surface of the dielectric window 60. Here, if the film deposited on the surface of the dielectric window 60 or the like is peeled off and adheres to the substrate S, that will lead to a deterioration or deficiency in film quality.

Thus, in the case where there are provided a plurality of plasma processing means 32 (plasma sources), it is especially desirable, as shown in FIG. 5, to arrange the plasma processing means 32 such that no substrate S exists vertically below any one of the plasma processing means 32 while this also applies to the case where only one plasma processing means 32 is provided.

Figure 6:
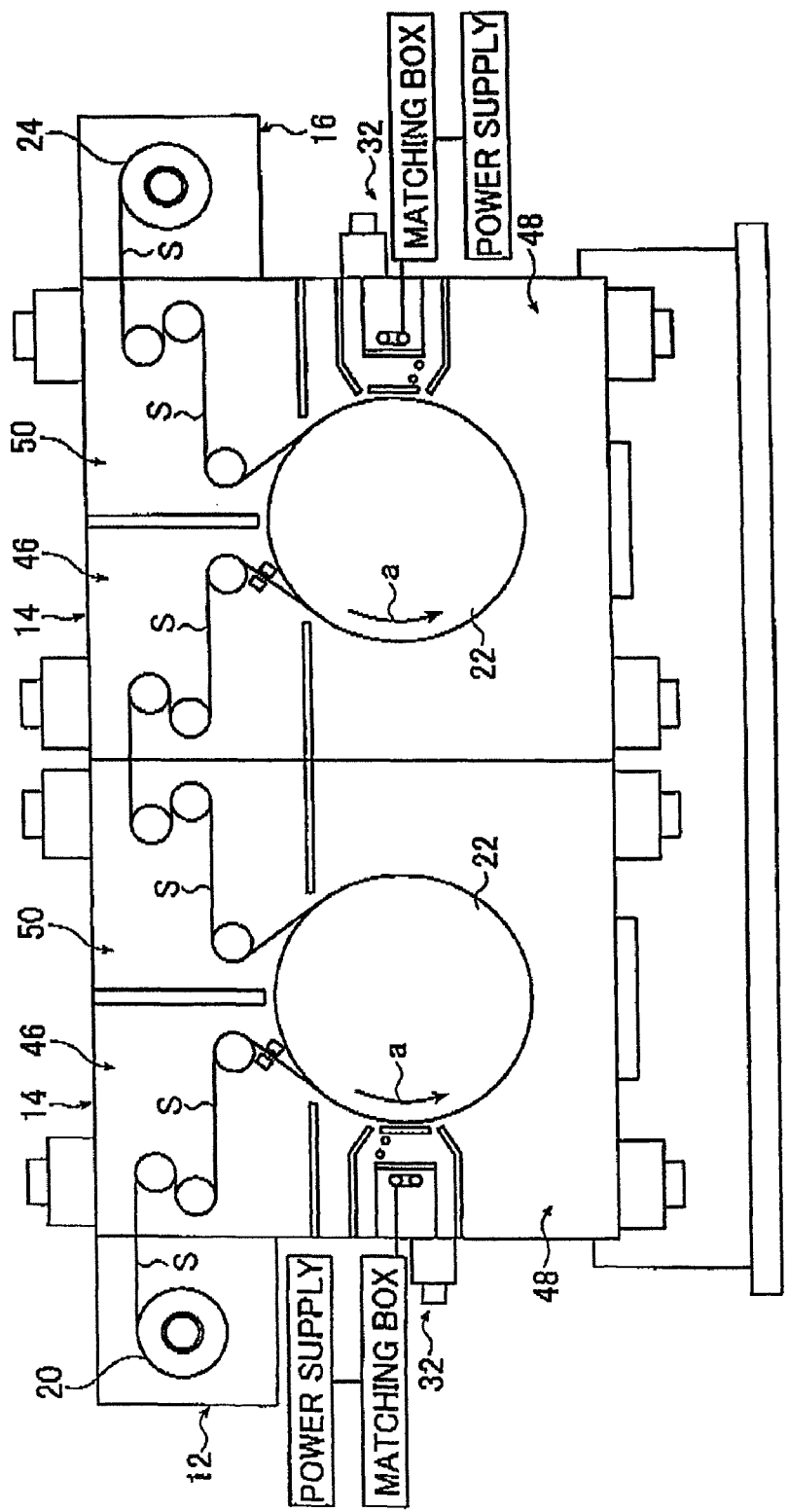
FIG. 6 is a conceptual diagram showing another embodiment of a CVD apparatus to which a plasma apparatus according to the present invention is applied.

While the CVD apparatus 10 of the illustrated embodiment has only one film forming portion 14, the CVD apparatus of the present invention is not limited to as such and may have a plurality of film forming portions 14 connected as shown in FIG. 6 according to the thickness of the film to be formed, the number of layers in the film to be formed, etc.

In the present invention, the number of film forming portions 14 connected is not restricted to two, and it is also possible to connect three or more film forming portions 14. Further, it is also possible to provide a plurality of plasma processing means 32 in one or more film forming portions 14, and it is also possible for the respective film forming portions 14 to have different numbers of plasma processing means 32.

While in the above-described embodiments, as a preferred mode, there is used the drum 22 as the conveying means for the substrate S that conveys the elongated substrate S wrapped around the same, this should not be construed restrictively; it is also possible to use various types of constructions using various types of conveying means as long as they have an elongated plasma source (the coil 58 (electric field forming means), the dielectric window, and the gas introducing means) arranged such that its longitudinal direction is matched with the width direction of the substrate.

For example, it is also possible to adopt a construction in which, as shown in FIG. 7, there are used as conveying means guide rollers 82 for guiding the elongated substrate S via a predetermined route, with the plasma processing means 32 being arranged so as to be opposed to the guide rollers 82 and to extend in the width direction of the substrate.

Figure 8:
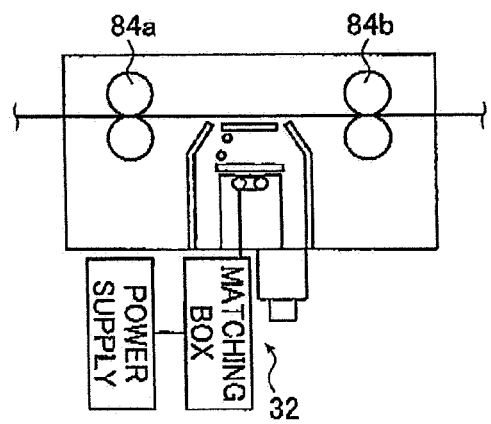
FIG. 8 is a conceptual diagram showing an embodiment of a CVD apparatus to which a plasma apparatus according to the present invention is applied.

Alternatively, as shown in FIG. 8, it is also possible to use a set of conveying roller pairs 84*a* and 84*b* respectively arranged on both sides of a predetermined processing position with respect to the conveying direction of the substrate and adapted to convey the substrate S while situated at the processing position, with the plasma processing means 32 being arranged between these conveying roller pairs.

Further, the present invention is not restricted to the construction in which the substrate S is drawn out of a substrate roll formed by winding an elongated substrate S and is taken up as a processed roll 24 after undergoing the processing by plasma CVD such as a film formation. The present invention is also applicable to a construction in which a film formation or the like is performed on cut-sheet-like substrates.

Further, the present invention is not restricted to the film formation by plasma CVD, either. For example, the present invention is also suitably applicable to various uses other than the film formation as long as they are ones in which various processings are performed by plasma generated by the ICP system such as a plasma cleaning of substrate surfaces and a modification of substrate surfaces including an impartation of an affinity for water thereto.

The plasma apparatus and the plasma processing method of the present invention are not restricted to the embodiments described in detail above, and it goes without saying that various improvements and modifications can be made as long as they do not depart from the gist of the present invention.

What is claimed is:

1. An inductive coupling type plasma apparatus, comprising:
   a conveying means for conveying a substrate having a predetermined width in a predetermined conveying direction along a predetermined conveying path so as to pass through a predetermined processing linear area elongated in a width direction of said substrate orthogonal to the predetermined conveying direction;
   electric field forming means for forming an induction electric field by a coil, said electric field forming means being elongated to have a first length in the width direction, opposed to said predetermined processing linear area and arranged in parallel to said predetermined processing linear area in such a way that a longitudinal direction of said electric field forming means is matched with a width direction of said substrate being conveyed;
   gas introducing means for introducing gas containing at least plasma gas in said predetermined processing linear area to supply the gas on said substrate, said gas introducing means being elongated to have a second length in the width direction and arranged in parallel to said predetermined processing linear area between said predetermined processing linear area and said electric field forming means in such a way that a longitudinal direction of said gas introducing means is matched with the width direction; and
   separating means for separating a region where said electric field forming means is arranged and a region where said gas introducing means is arranged from each other in an airtight fashion, said separating means having a dielectric window which is elongated to have a third length in the width direction and arranged in parallel to said predetermined processing linear area between said predetermined processing linear area and said electric field forming means in such a way that a longitudinal direction of said dielectric window is matched with the width direction, wherein
   said substrate is processed with plasma generated from the plasma gas by the induction electric field formed by said electric field forming means while said substrate is conveyed to pass through the predetermined processing linear area, and
   said electric field forming means is arranged along said dielectric window in parallel to said dielectric window.

2. The plasma apparatus according to claim 1, wherein said conveying means is a cylindrical drum around a circumferential surface of which said substrate is wrapped.

3. The plasma apparatus according to claim 1, wherein said substrate is supplied to said conveying means from a feeding roll formed by winding an elongated substrate into a roll and is wound around a take-up roll after being fed by said conveying means.

4. The plasma apparatus according to claim 1, wherein a distance from at least one of said electric field forming means, said gas introducing means and said separating means to said processing linear area is adjustable.

5. The plasma apparatus according to claim 1, wherein said plasma apparatus has plural sets of said electric field forming means, said gas introducing means and said separating means which are arranged on the predetermined conveying path of said substrate and have processing linear areas, respectively.

6. The plasma apparatus according to claim 5, wherein said plural sets of said electric field forming means, said gas introducing means and said separating means are partitioned from each other by wall portions in a substantially airtight fashion.

7. The plasma apparatus according to claim 6, further comprising an openable shutter partitioning each of said processing positions and an inner side of each of said wall portions from each other.

8. The plasma apparatus according to claim 6, further comprising a vacuum evacuation means provided for said inner side of each of said wall portions.

9. The plasma apparatus according to claim 1, wherein said coil is an induction coil having an elongated configuration and said first length and said induction coil is arranged along said dielectric window in parallel to said dielectric window in such a way that a longitudinal direction of said coil is matched with the width direction of said substrate being conveyed.

10. The plasma apparatus according to claim 9, wherein said induction coil comprises a tube formed of metal bent in a substantially U-shaped elongated configuration having two elongated regions, and said two elongated regions are arranged along said dielectric window in parallel to said dielectric window.

11. The plasma apparatus according to claim 9, wherein said induction coil comprises small coils formed of a metal tube, and said small coils are arranged along said dielectric window in parallel to said dielectric window.

12. The plasma apparatus according to claim 1, further comprising means for adjusting an introducing direction in which a gas is introduced by said gas introducing means.

13. The plasma apparatus according to claim 1, wherein said plasma apparatus has plural gas introducing means provided at different positions in a direction of a gap between said predetermined processing position and said dielectric window.

14. The plasma apparatus according to claim 1, wherein said dielectric window is situated horizontally with respect to said predetermined processing position or vertically below said predetermined processing position.

15. The plasma apparatus according to claim 1, wherein said electric field forming means, said gas introducing means and said separating means are formed as one set into an integral unit which is detachable.

16. The plasma apparatus according to claim 1, wherein said first length of said electric field forming means, said second length of said gas introducing means and said third length of said dielectric window are substantially equal to or slightly longer than said predetermined width of said substrate.

17. The plasma apparatus according to claim 1, wherein
said gas introducing means comprises an elongated cylindrical pipe one end of which is closed and the other end of which is connected to a gas supply source,
through-holes serving as gas ejection holes for ejecting the gas toward said predetermined processing linear area are formed in a circumferential surface of said elongated cylindrical pipe along the width direction, and
said elongated cylindrical pipe has said second length and is arranged along said dielectric window in parallel to said dielectric window.

18. The plasma apparatus according to claim 1, wherein
said gas contains the plasma gas and film formation gas used for forming a predetermined film on said substrate,
said gas introducing means comprises a first gas introducing means for introducing the plasma gas in said predetermined processing linear area to supply the plasma gas on said substrate, and a second gas introducing means for introducing the film formation gas in said predetermined processing linear area to supply the film formation gas on said substrate, and
said first gas introducing means and said second gas introducing means are have said second length and are arranged along said dielectric window in parallel to said dielectric window.

19. The plasma apparatus according to claim 18, wherein
said first gas introducing means is provided on a side nearer to said dielectric window of said separating means than said predetermined processing linear area, and
said second gas introducing means is provided on a side nearer to said predetermined processing linear area than said dielectric window.

* * * * *